United States Patent [19]

Dickman et al.

[11] 4,359,817

[45] Nov. 23, 1982

[54] METHOD FOR MAKING LATE PROGRAMMABLE READ-ONLY MEMORY DEVICES

[75] Inventors: John E. Dickman, Russiaville; William B. Donley, Kokomo, both of Ind.

[73] Assignee: General Motors Corporation, Detroit, Mich.

[21] Appl. No.: 268,090

[22] Filed: May 28, 1981

[51] Int. Cl.³ .............................................. H01L 21/22
[52] U.S. Cl. .................................. 29/571; 29/576 B; 29/578; 29/577 C; 148/187
[58] Field of Search ..................... 29/571, 576 B, 578, 29/577 C; 148/187

[56] References Cited

U.S. PATENT DOCUMENTS

| | | | |
|---|---|---|---|
| 3,475,234 | 10/1969 | Kerwin et al. | 148/187 |
| 3,775,191 | 11/1973 | McQuhae | 148/1.5 |
| 3,816,905 | 6/1974 | Bernard et al. | 29/571 |
| 3,914,855 | 10/1974 | Cheney et al. | 29/571 |
| 3,917,495 | 11/1975 | Horn | 148/187 |
| 4,080,718 | 3/1978 | Richman | 29/571 |
| 4,091,406 | 5/1978 | Lewis | 357/54 |
| 4,103,415 | 8/1978 | Hayes | 29/571 |
| 4,129,936 | 12/1978 | Takei | 29/571 |
| 4,151,020 | 4/1979 | McElroy | 29/577 C |
| 4,198,693 | 4/1980 | Kuo | 29/571 X |
| 4,235,011 | 11/1980 | Butler et al. | 29/577 C |
| 4,267,632 | 5/1981 | Shappir | 29/571 |
| 4,294,001 | 10/1981 | Kuo | 29/576 B |
| 4,295,209 | 10/1981 | Donley | 357/91 X |
| 4,317,690 | 3/1982 | Koomen et al. | 29/576 B |
| 4,326,329 | 4/1982 | McElroy | 148/187 X |

Primary Examiner—G. Ozaki
Attorney, Agent, or Firm—Robert J. Wallace

[57] ABSTRACT

A method of making a high speed and high density IGFET read-only memory and encoding it late in said method. A unique ROM structure permits encoding by ion implantation thin apertures in a phosphosilicate glass layer, without requiring ROM output lines passing over the implant apertures or expanding ROM size to obtain highest ROM operating speed.

5 Claims, 22 Drawing Figures

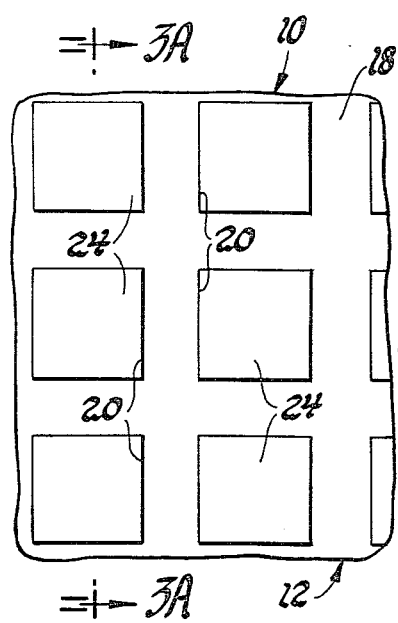
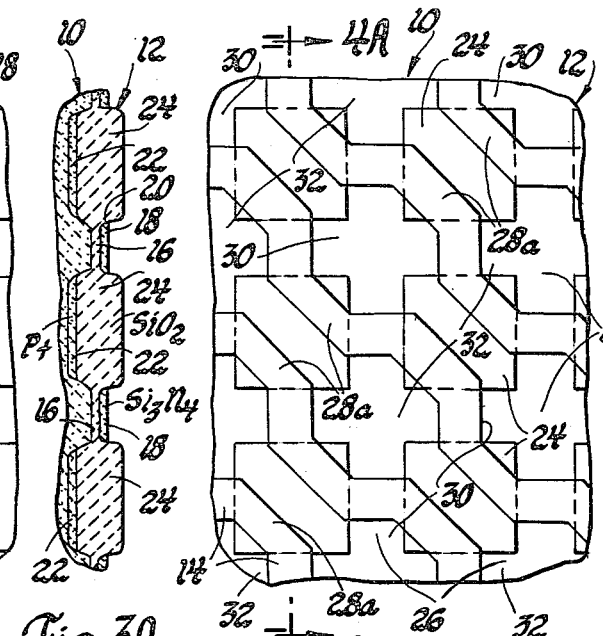
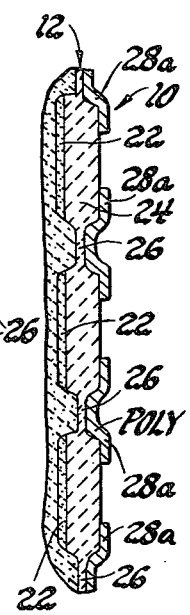
Fig.3  Fig.3A  Fig.4  Fig.4A
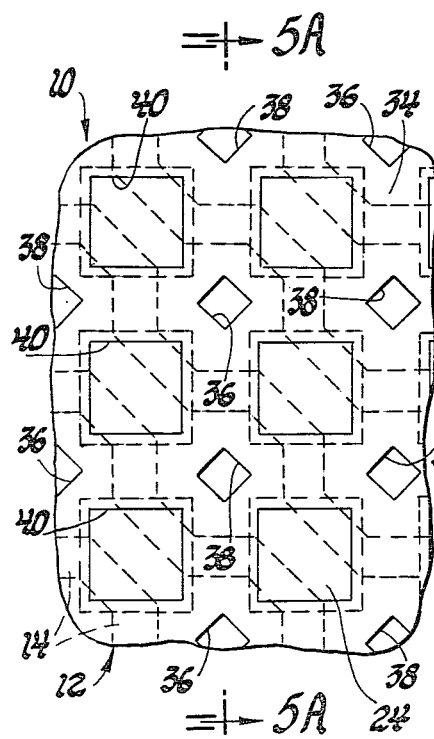
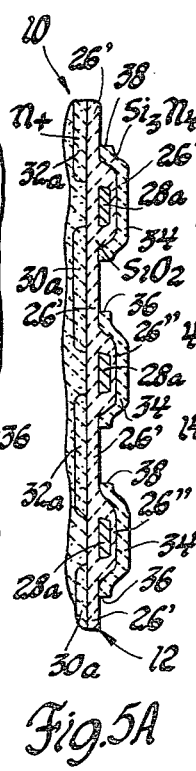
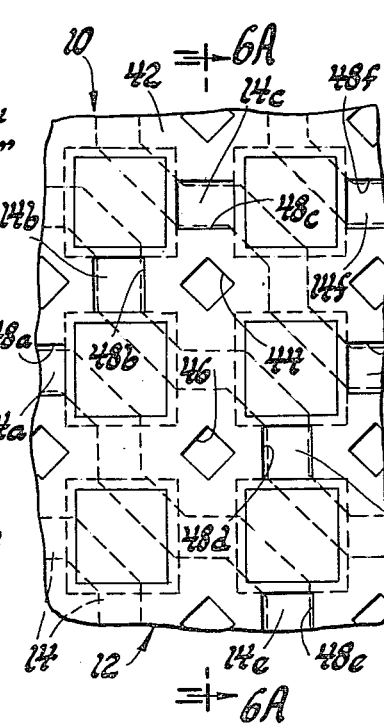
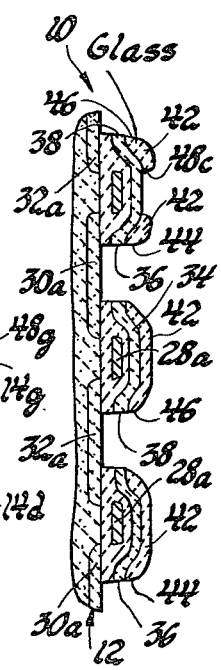
Fig.5  Fig.5A  Fig.6  Fig.6A

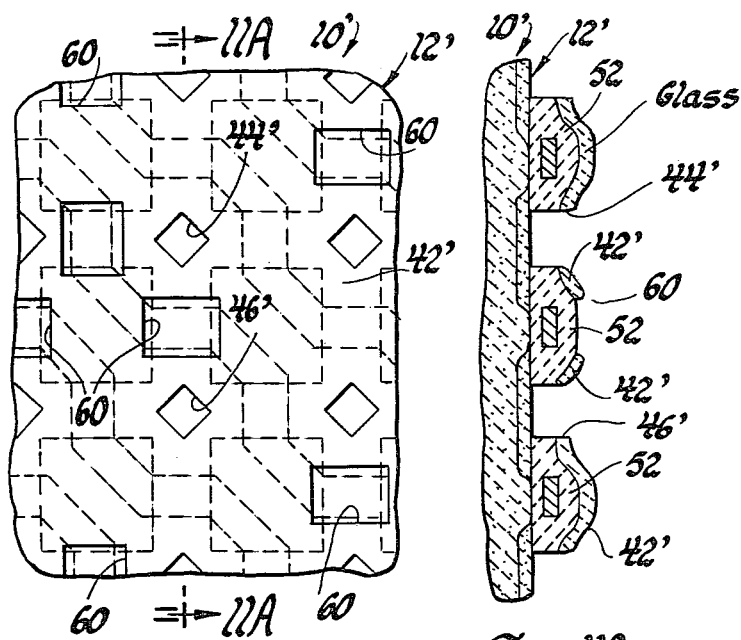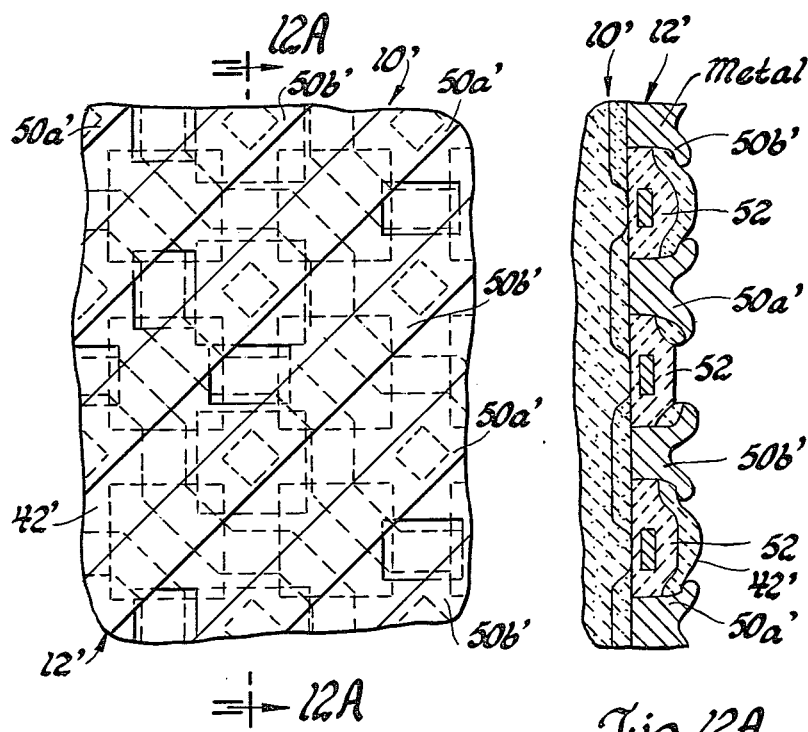

METHOD FOR MAKING LATE PROGRAMMABLE READ-ONLY MEMORY DEVICES

RELATED PATENT APPLICATIONS

This invention is related to our following concurrently filed and similarly assigned United States applications:

Ser. No. 268,086 LATE PROGRAMMING ENHANCED CONTACT ROM
Ser. No. 268,089 LATE PROGRAMMING USING SECOND LEVEL POLYSILICON MASK
Ser. No. 268,088 LATE PROGRAMMING USING A SILICON NITRIDE INTERLAYER

This invention is also-related to W. B. Donley's U.S. Ser. No. 098,211, now U.S. Pat. No. 4,295,209 entitled "Programming an IGFET Read-Only-Memory" and filed Nov. 28, 1979.

FIELD OF THE INVENTION

This invention relates to programming an insulated gate field effect transistor (IGFET) read-only memory (ROM) late in its method of manufacture. It more specifically relates to making a ROM of peculiar geometry by a process which allows late programming by ion implantation while preserving minimum ROM size and maximum ROM operating speed.

BACKGROUND OF THE INVENTION

U.S. Pat. No. 4,295,209 discloses late programming an IGFET ROM by ion implantation through openings in an overlying phosphosilicate glass layer immediately before metallization. The ion implantation is done through a polycrystalline silicon gate electrode of selected IGFETs in the ROM. Small size in the ROM is preserved in U.S. Pat. No. 4,295,209 by incorporating a silicon nitride coating immediately beneath the phosphosilicate glass layer. Consequently, when implant openings are etched in the phosphosilicate glass layer, the polycrystalline silicon gate electrode is not exposed. Accordingly, metal lines can cross directly over the implant openings without contacting the gate electrodes. However, the silicon nitride coating is ordinarily thin and there can be a capacitive coupling which occurs between the drain lines and the polysilicon gate within the implant windows. In larger size ROMs this capacitive coupling can become significant enough to slow down the speed of the ROM.

In our above-mentioned concurrently filed Ser. No. 268,086, we disclose a different late programming process by which high operating speed can be retained with ROMs of the usual construction. We have now found a technique by which ion implantation can be used in substantially the same way as outlined in the aforementioned U.S. Pat. No. 4,295,209 but without a penalty of slower operating speed or expanded size in larger ROMs. We have discovered that the U.S. Pat. No. 4,295,209 late programming method is effective on a high density ROM of unique configuration. The unique configuration was previously known and is referred to as a hexagonal ROM. This unique configuration does not require metal lines to cross implant windows in the reflowable glass layer. Thus, capacitive coupling is minimized. Accordingly, both highest speed and maximum ROM density is retained.

OBJECTS AND SUMMARY OF THE INVENTION

It is, therefore, an object of this invention to provide a method of programming a ROM late in its manufacturing method without large ROMs needing expansion in size to obtain highest ROM operating speed.

Another object of the invention is to provide a method of programming a hexagonal-type ROM by ion implantation through openings in an overlying phosphosilicate glass layer immediately prior to metallization, wherein ROM drain lines need not cross the implant openings.

This invention comprehends coding a unique ROM array by ion implantation through windows in a phosphosilicate glass layer, immediately prior to metallization. The ROM is unique in that it is formed of an orthogonal grid of gate thickness dielectric on a silicon surface within an area covered by a field thickness dielectric. Diagonally disposed gate lines cross grids of vertical and horizontal areas to form a matrix of gates with interjacent silicon regions covered by a thin silicon dioxide layer. Alternate points of intersection in the matrix alternately form source regions and drain regions, with each region communicating with four gates. Alternate source and drain lines run parallel to one another diagonally on the matrix but oppositely from the diagonal gate lines, so that they are orthogonal to the gate lines.

BRIEF DESCRIPTION OF THE DRAWINGS

Other objects, features and advantages of this invention will become more apparent from the following description of preferred examples thereof and from the drawings, in which:

FIGS. 3 through 7 show plan views of the ROM fragment illustrated in FIG. 1 in progressive stages of its manufacturing method;

FIGS. 3A through 7A are sectional views along the line A—A of FIGS. 3 through 7, respectively;

FIGS. 8 through 12 show plan views of an alternative embodiment of the ROM fragment illustrated in FIG. 1 in progressive stages of its manufacturing method; and FIGS. 8A through 12A show sectional views along the line A—A of FIGS. 8 through 12, respectively.

DESCRIPTION OF THE PREFERRED EMBODIMENTS

Figure 1:
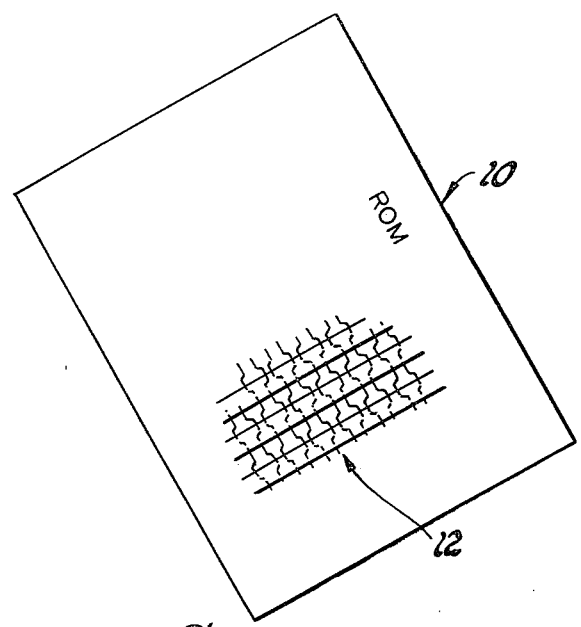
FIG. 1 is a diagrammatic view showing a ROM chip and further shows an enlarged fragment of a ROM array in plan view.

FIG. 1 shows a silicon chip 10 containing an IGFET ROM array. As previously indicated, by ROM we mean a read-only-memory. By IGFET, we mean an insulated gate field effect transistor. A ROM essentially is a repetitive pattern of IGFET channels, i.e. gates, arranged in columns and rows. The channels interconnect adjacent source and drain regions. In this invention the source and drain regions have a distinctive configuration as well as the gate lines. For illustrative purposes, portion 12 of a ROM array is shown on the chip 10 of FIG. 1 in enlargement. The ROM is formed from an orthogonal grid of gate thickness dielectric on a silicon surface within an area covered by a field thickness dielectric. A plurality of diagonal sinuous but generally parallel gate lines 28a on the grid, cross grid columns between grid rows, to form a matrix of gates 14 and silicon regions covered by thin oxide between the gates. The silicon regions are doped to opposite conductivity type from that of the original silicon surface. A plurality of metal lines 50a and 50b diagonally disposed on said grid and orthogonally disposed with respect to the gate lines 28a provides alternate source and drain lines for these regions. A gate 14 occurs along each gate line 28a between the source and drain metal lines.

Figure 2:
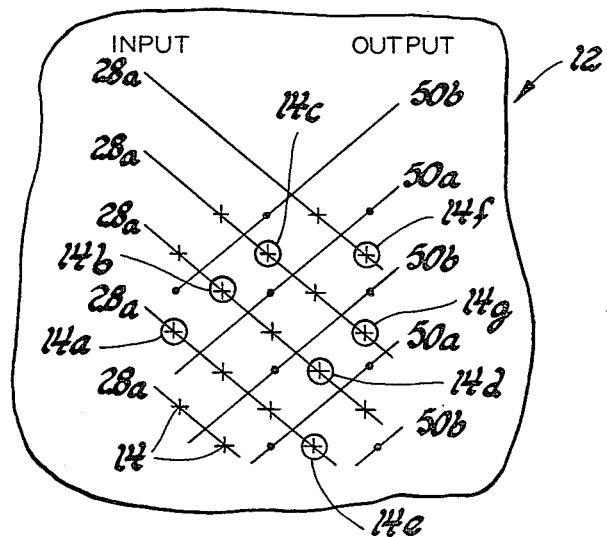
FIG. 2 shows an electrical schematic of the ROM array fragment illustrated in FIG. 1.

In FIG. 2 a gate is indicated along each gate line 28a by a "plus" sign. Those gates that are inoperative in the matrix are indicated by an encircled "plus" sign in FIG. 2, and are designated by reference numerals 14a, 14b, 14c, 14d, 14e, 14f and 14g. They correspond to similarly numbered gates in corresponding locations in FIGS. 3 through 7. The gates 14a through 14g appear as a "0" in the ROM code. They are a "0" because they are inoperative gates. They are inoperative because they have a threshold voltage above the normal ROM operating voltage. The balance of the gates are operative with respect to normal ROM operating voltage and appear as "1" in the ROM code. The ROM has a distinctive geometry, and is encoded by ion implantation as hereinafter described.

The chip 10, shown in FIG. 1, would ordinarily be one of many such chips integrally formed in a repetitive pattern on a monocrystalline silicon wafer about three or four inches in diameter and having a thickness of about 0.4–0.6 millimeter. It would typically be a homogeneous wafer having a resistivity of about 5–30 ohm-cm. The resistivity, of course, will depend upon the electrical characteristics of the finished devices desired. The thickness of the wafer is ordinarily a function of the wafer size being processed, with three inch wafers being about 0.4 millimeter thick.

FIGS. 3 through 7 and 3A through 7A illustrate a first embodiment of the invention and show chip 10 made to have the ROM code shown in FIG. 2. The silicon wafer containing chip 10 is initially lapped, polished and cleaned in the normal and accepted manner. It is then oxidized in air or oxygen at about 1000° C. or more to produce an initial blanket coating of silicon dioxide on the surface of the wafer about 700–1000 Angstroms thick. A blanket coating of silicon nitride ($Si_3N_4$) is then deposited by chemical vapor deposition or the like on top of the silicon dioxide coating 16. Silicon nitride coating 18 can be deposited in any convenient manner, as for example by pyrolysis of a silicon-containing gas at a high temperature, as disclosed in U.S. Pat. No. 3,917,495 Horn. A glow discharge plasma reaction between silane and nitrogen with or without ammonia at about 300° C. is described in U.S. Pat. No. 4,091,406 Lewis for production of a silicon nitride coating that is not quite stoichiometric.

A photoresist is then applied to the silicon wafer over silicon nitride coating 18, and an array of rectangular openings formed in it. The photoresist openings correspond to apertures 20 shown in the silicon nitride coating 18 in FIG. 3. Wafer 10 is then plasma etched with carbon tetrafluoride and oxygen, or wet etched with orthophosphoric acid ($H_3PO_4$) at 150°–160° C. for 10–60 minutes. The etching opens windows 20 in silicon nitride coating 18 for field oxidation.

The wafer is given a blanket implant of $^{11}B+$ at a dosage of about $6 \times 10^{12}$ ions per square cm at an energy of approximately 70–80 keV. This provides P+ channel stop regions 22 beneath islands of thick field oxide 24 that are to be subsequently grown within silicon nitride windows 20.

The photoresist used in opening windows 20 is then removed from the wafer, and the wafer placed in a furnace. The wafer is oxidized in the furnace under steam or moist oxygen at about 1000°–1100° C. for several hours. This provides a thick field oxide layer 24, about 6000–12,000 Angstroms thick, within each of windows 20, in the silicon nitride coating 18. During field oxidation, the upper surface of field oxide 24 rises above the matrix covered by silicon nitride coating 18. Also, the field oxide 24 consumes underlying silicon as it grows. However, P+ regions 22 diffuse inwardly faster than the silicon is consumed. Hence, P+ regions appear beneath thick oxide 24 in FIGS. 3A–7A.

After field oxidation, the balance of the silicon nitride coating 18 on chip 10 is removed by plasma etching with carbon tetrafluoride or by immersion in orthophosphoric acid ($H_3PO_4$) at about 150°–160° C. for about 10–60 minutes. The matrix of initially deposited silicon dioxide 16, which underlies the silicon nitride coating 18, is removed next. It is removed by simply immersing the wafer in concentrated hydrofluoric acid, ammonium bifluoride or the like, for approximately 1–2 minutes at room temperature. Such immersion is sufficient to etch away all of the thin silicon dioxide 16 but leave a significant thickness of the field oxide 24 remaining.

The wafer is then placed in a furnace having an air or oxygen atmosphere, and heated to a temperature of approximately 900°–1100° C. for a sufficient duration to grow a new thin silicon oxide layer 26 in the matrix area where it was just removed. A thickness of about 700–1000 Angstroms is grown as described above, as a gate dielectric for ROM gates to be formed. The wafer is then given another blanket $^{11}B+$ ion implantation, to set threshold voltage of all ROM gates 14 to be subsequently formed. Implantation with $^{11}B+$ in a dosage of about $2 \times 10^{11}$ ions per square cm at about 40–50 keV is an example of what might be used. However, the particular dopant, dosage and power used can be varied, as should be understood. At this point in our process the gate oxide layer 26 is present in a grid-like pattern or matrix surrounding the rectangular islands of field oxide 24.

A blanket coating (not shown) of polycrystalline silicon is deposited over the entire surface of the wafer, including chip 10. The polycrystalline silicon coating can be deposited in any convenient manner, as for example by vapor deposition, evaporation, sputtering or the like. In general, it would be about 4000–7000 Angstroms thick for self-aligning gate purposes. At least 4000 angstroms is generally needed to obtain a sufficiently low resistance gate line. However, above about 7000 angstroms in thickness, the polycrystalline silicon layer produces undesirably high step heights. Also, thicknesses above about 7000 Angstroms may require ion beam energies greater than about 150–200 keV to penetrate them. It should be recognized that the polycrystalline silicon will eventually be in the form of generally parallel lines 28a that must be orthogonally crossed by an overlying metallization network. The polycrystalline silicon layer is preferably undoped, i.e., intrinsic, as deposited, and then subsequently doped with an N-type impurity during the diffusion step which forms the source and drain regions 30a and 32a in a succeeding process step. In any event, the polycrystalline silicon coating should be doped as to sheet resistivity of about 20-50 ohms per square, whether the doping be as deposited, or as subsequently performed by ion implantation or diffusion.

The polycrystalline silicon coating is then photolithographically etched to define the sinuous polycrystalline silicon gate lines 28a. While gate lines 28a are generally parallel to each other, they are sinuous or undulated to permit them to orthogonally alternately cross rows and columns of the silicon matrix by the thin silicon dioxide layer 26. In other words, each gate line 28a has two successive 45° bends in one direction when seen in plan view, and two successive bends in the opposite direction. Each gate line 28a thus orthogonally crosses the thin oxide layer 26 alternately in a row and then in a column between rows. This concurrently defines generally cruciform areas 30 and 32, which are covered by adjacent gate oxide 26.

The polycrystalline silicon coating can be defined by etching in the same manner as described in U.S. Pat. No. 3,475,234 Kerwin et al. For example, after covering the polycrystalline silicon coating with an appropriate photoresist pattern, the wafer is immersed in a mixture of hydrofluoric, nitric and acetic acids saturated with iodine. This coating can also be plasma etched using carbon tetrafluoride. After the gate lines 28a have been defined, the thin silicon dioxide layer 26 covering the cruciform areas 30 and 32 is removed by immersing the wafer in ammonium bifluoride or hydrofluoric acid.

N+ source regions 30a and drain regions 32a are then respectively formed in the cruciform regions 30 and 32 by diffusion. Concurrently, the gate lines 28a are doped to make them sufficiently conductive. This is analogous to the techniques described in U.S. Pat. No. 3,475,234 Kerwin et al. In the later stages of the diffusion, the drive-in atmosphere is changed to oxidizing to regrow a thin oxide coating 26' on cruciform areas 30 and 32 over the diffusion regions 30a and 32a. Concurrently this oxidizes the exposed portions of the polycrystalline silicon gate lines 28a, to grow a thin layer 26" of silicon dioxide thereon. The status of the chip at this point is illustrated in FIG. 5.

The phosphorus can be diffused into the source and drain regions 30a and 32a and into the gate lines 28a by placing the wafer in a furnace maintained at a temperature of about 950°-1050° C. About 3.5 liters per minute argon and 10-50 cc per minute oxygen flows through the furnace. After a 5 minute wafer preheat, additional argon is bubbled through phosphorus oxychloride at about 21° C. and bled into the furnace atmosphere at a rate of about 10-100 cubic centimeters per minute. After a second 5 minute period, the additional argon flow is discontinued. The wafer is left in the furnace for a third 5 minute period at a post bake step. The wafer is then heated to a temperature of about 950°-1050° C. for about ½ to 2 hours in a moderately to strongly oxidizing atmosphere, to drive-in the phosphorus. The particular times, temperatures and atmospheres used for the deposition and drive-in are a matter of choice and are determined by the electrical characteristics of the device desired. In any event, a thin silicon dioxide coating 26' is reformed over the N+ regions 30a and 32a. A thin silicon dioxide coating 26" is formed over the gate lines 28a. Silicon dioxide coating 26' will range in thickness from about 100-1000 angstroms on regions 30a and 32a. It will be thicker on gate lines 28a, and for this reason is designated by reference numeral 26".

A second blanket coating 34 of silicon nitride ($Si_3N_4$) is then deposited onto the wafer and photolithographically etched under conditions such as hereinbefore described for silicon nitride coating 18. However, this time the silicon nitride coating 34 is patterned differently. The newly applied silicon nitride coating 34 is delineated to open source contact windows 36 over source region 30a and drain contact windows 38 over drain region 32a. It is delineated by etching in the manner hereinbefore described for silicon nitride coating 18. We prefer to also etch the silicon nitride coating 34 from over the islands 24, so that when viewed in cross section in FIG. 5A the silicon nitride only appears as a patch over every gate in the ROM. In the plan view of FIG. 5, windows 40 are formed in silicon nitride 34 over oxide islands 24. The silicon nitride layer 34 is relatively thin, only about 200-1000 Angstroms in thickness. Below about 200 Angstroms, the silicon nitride coating 34 may not be continuous. Thicknesses greater than about 1000 Angstroms appear to be unnecessary. Moreover, they require progressively more powerful ion beams to penetrate them. Still further, when the silicon nitride thickness reaches about 2000 Angstroms its difference in thermal expansion properties, from those of silicon, can cause silicon nitride cracks.

After the source and drain contact windows 36 and 38 are opened in silicon nitride layer 34, a relatively thick blanket layer of phosphorus doped glass 42 is deposited onto the silicon nitride layer 34. The wafer is then heated to reflow the glass 42 and provide a smoother surface upon which a metallization pattern can be deposited. The phosphorus doped glass 42 can be deposited in any convenient manner as for example by chemical vapor deposition. Any of the normal and accepted deposition techniques and glass-like materials ordinarily used to passivate and smooth out the surface of IGFET ROMs can be used in this invention too. By way of example is deposition of the glass layer 42 formed by chemical vapor deposition of silane and phosphine. The minimum thickness of glass which is needed to smooth out the upper surface of the wafer will vary. However, a thickness of about 5000-15,000 Angstroms is ordinarily preferred. One desires a layer thickness sufficient to block an ion beam and smooth out the wafer surface but not so thick that etching becomes too difficult. Since the silicon nitride coating previously applied in accordance with this invention does not appreciably round the corners on gate lines 28a, the normal thickness used in making IGFET ROMs would be used in this invention too.

As mentioned, the glass layer 42 is of a composition which is reflowed to provide a smoother surface on which to subsequently deposit a metallization pattern. Any silicate serving this function is considered to be a glass for purposes of this invention. We prefer to use a glass having a melting point temperature that permits reflow at about 1000°-1100° C. in about 10 minutes. Higher temperatures and/or longer periods of time are not desired, since they can produce unwanted diffusion within chip 10.

Next, the glass layer 42 is photolithographically etched to open contact windows 44 and 46 in it over the source and drain windows 36 and 38, respectively, that were previously opened in the silicon nitride layer 34. However, in addition, an ion implant window 48a-48g is also opened over each of gates 14a-14g, down to the underlying silicon nitride layer 34. The windows 48a-48g extend completely across the width of gates 14a-14g. However, they need not extend along the complete length of these gates. The polycrystalline silicon gate lines 28a are not exposed in windows 48a–48g because they are protected by a covering portion of the silicon nitride layer 34. The glass layer 42 is photolithographically etched in the normal and accepted manner. For example, hydrofluoric acid or an ammonium bifluoride etchant can be used. Such etchants attack the glass layer 42 but do not appreciable attack the silicon nitride layer 34.

Before removing the resist used to etch the windows 44, 46 and 48 in glass layer 42, the wafer is given a blanket implant of boron with sufficient energy and dose to turn off gates 14a through 14g which lie beneath the ion implant windows 48a through 48g. As previously indicated the gate oxide layer 26, polycrystalline silicon coating 28, and silicon nitride coating 34 are of sufficiently small thickness as to be penetrable by an energetic ion beam, as hereinbefore indicated. If the wafer is implanted with a $^{11}B+$ ion beam having an energy of about 150–200 keV in a dosage of about $1 \times 10^{13} - 1 \times 10^{14}$ atoms per square cm, gates 14a–14g will be effectively turned off. Such a dosage does not materially reduce source and drain regions 30a and 32a, even though exposed in windows 36, 38, 44 and 46. On the other hand, such a dosage is sufficient to raise threshold voltage of the IGFET channel of gates 14a through 14g to a value significantly higher than the 5 volts normally applied to the gate lines 28a. Accordingly, those gates 14a–14g will not turn "on" when the normal 5 volts is applied to gate lines 28a. Hence, gates 14a–14g are effectively rendered inoperative. On the other hand, the balance of the gates 14 remains at the original low threshold voltage and continues to be operative. Hence, gates 14a–14g represent a "0" in the ROM code. However, the balance of the gates 14 represent a "1" in the resultant ROM code.

As with the previously mentioned ion implantations, the particular dosage and energy required for the encoding ion implantation can be varied. In substance any dosage and energy that will effectively make the desired ROM gates unresponsive in the ROM circuit can be used. The particular dosage and energy needed will vary, of course, depending upon the operating potential selected for the ROM gate lines 28a, the initial resistivity of silicon wafer, the thickness of the polycrystalline silicon coating 28, associated oxide layers, etc. In most instances an energy of about 150–200 keV would probably be desired and a dosage of about $1 \times 10^{14}$ ions per square cm. Still further, while we describe implanting the affected gate with $^{11}B+$, it is recognized that other P-type impurities could be used to increase IGFET channel P-type doping, and the attendant IGFET threshold voltage.

It should be recognized that if our example were of a p-channel IGFET ROM, instead of an n-channel IGFET ROM one would want to implant the channel with an N-type impurity to raise threshold voltage. Analogously, the ROM described in the foregoing example of the invention comprises an array of enhancement-type IGFETs. One might choose to make a ROM array using depletion-type IGFETs instead. This invention is also applicable to ROMs made with depletion-type IGFETs.

After the ion implantation, the photoresist is stripped from the wafer and a blanket coating of metal deposited onto the wafer over glass layer 42. The metal layer can be of any suitable metal in single or multiple layers. We prefer to use a single layer of aluminum or aluminum-silicon alloy applied by evaporation techniques. However, it should be understood that other metals could be used, as for example gold and silver. In addition, one might choose to substitute highly doped polycrystalline silicon for metal. In essence, any suitable conductor can be used.

The metal fills the source windows 36 and 44 in the silicon nitride coating 34 and glass layer 42. Analogously, it fills drain windows 38 and 46 in the silicon nitride coating 34 and the glass layer 42. The metal thus respectively makes contact with the source regions 30a and the drain regions 32a, as can be seen in FIG. 7A.

Figure 7:
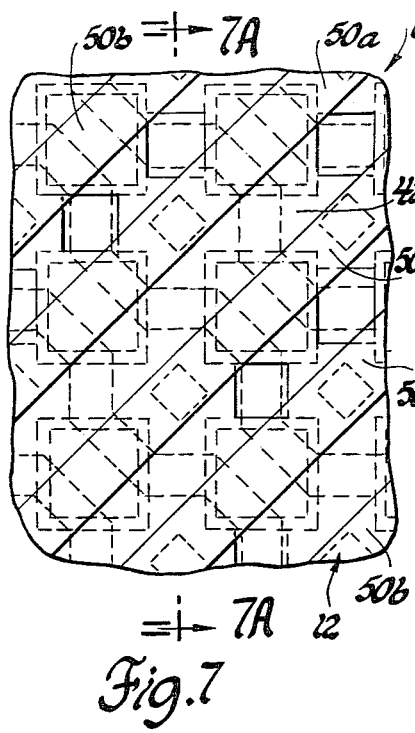
Figure 7A:
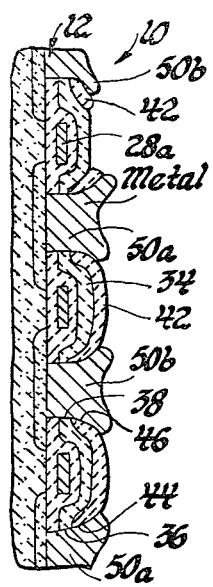

Referring now to FIG. 7, the blanket layer of metal is photolithographically etched, in a normal and accepted manner, to delineate a series of parallel metal strips alternately designated as 50a and 50b. Strip 50a represents source lines. Strip 50b represents drain lines. It can be seen that the source and drain lines 50a and 50b are parallel to each other and disposed diagonally on the array. On the other hand, they are orthogonally disposed with respect to the general direction of the oppositely diagonally disposed gate lines 28a.

As is understood for the type of IGFET ROM involved here, normal operating voltage is not applied simultaneously to all gates and all source lines. Instead, ancillary circuitry (not shown) is provided on other portions of chip 10 to sequentially appropriately apply the voltages to gate lines and source lines in proper sequence so that one can identify which of the four gates associated with every drain contact is inoperative, i.e., "0" in the ROM code. Such ancillary circuitry is already known and forms no part of this invention. Hence, it is not shown. We have also elected not to show applying a passivation layer over the entire surface of the metallized wafer. Windows are etched in the passivation coating where contacts are to be made to the metallization pattern from external circuitry. We elected not to show it because passivation coatings are not always necessary and the drawing is complex enough as it is. Any of the usual passivation coatings normally used in integrated circuits would be useful here. In essence, use of the passivation coating is no more important to this invention than it is to any other ROM. For example, a continuous passivation coating is normally needed when encapsulating a chip by injection molding. The passivation coating is needed to isolate the chip from various adverse interactions with the encapsulating plastic and/or other undesirable contaminants. However, packaging in a previously molded ceramic flat pack may not require the passivation coating.

Reference is now made to FIGS. 8–12 and 8A–12A of the drawing. These figures of the drawing illustrate a second embodiment of the invention contemplated herein. In this second embodiment of this invention, a thick thermally formed silicon dioxide coating 52 is substituted over the IGFET channels 54 for the silicon nitride coating 34 of the first invention embodiment. Silicon nitride coating 34 is shown in FIGS. 5–7 and FIGS. 5A–7A of the drawing hereof. The thermal oxide coating 52 is shown in FIGS. 10–12 and FIGS. 10A–12A of the drawing. It is derived by oxidizing a blanket layer of polycrystalline silicon (not shown) on the wafer. This produces a blanket coating of thermal oxide. Source and drain contact openings 56 and 58 are etched in this blanket coating 52 of thermal oxide in the same pattern as used for silicon nitride coating 34. In this connection, compare FIGS. 5 and 10 and FIGS. 5A and 10A. The balance of the process for this second embodiment of the invention is analogous to the process hereinbefore described.

Figure 8:
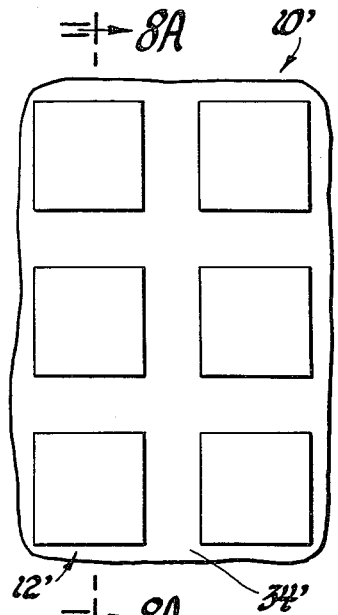
Figure 8A:
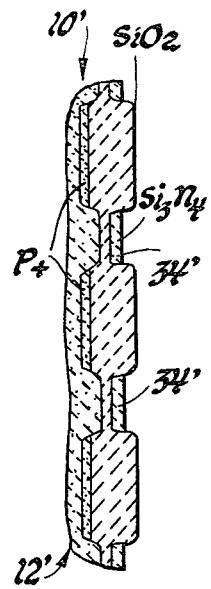
Figure 9:
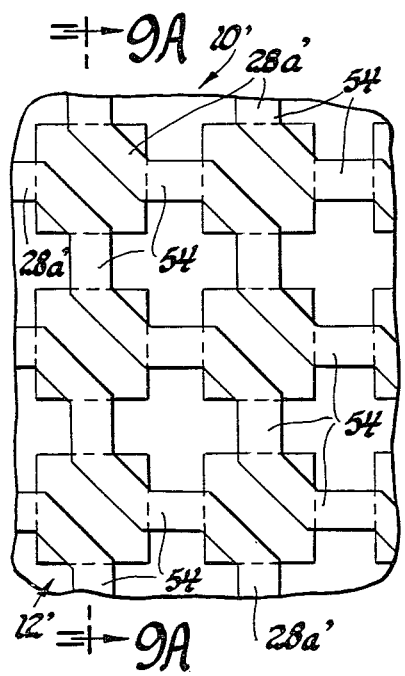
Figure 9A:
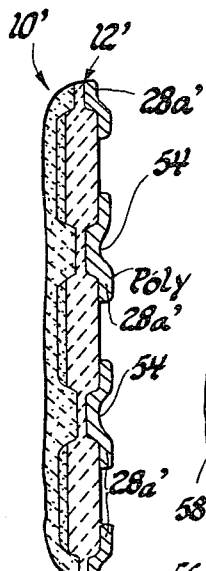
Figure 10:
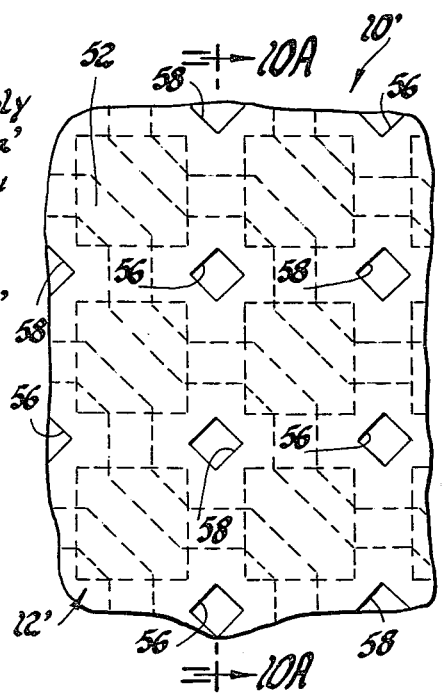
Figure 10A:
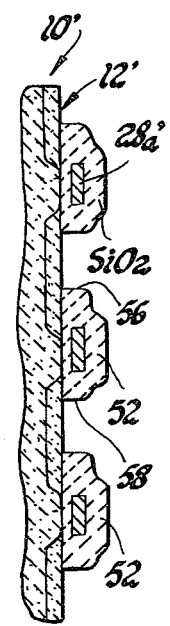

FIGS. 8 and 9 are identical to FIGS. 3 and 4, and FIGS. 8A and 9A being identical to FIGS. 3A and 4A, FIGS. 10–12 and 10A–12A are analogous to FIGS. 5–7 and 5A–7A. To better show that this is a separate and distinct embodiment of the invention, IGFET channels 54 are programmed differently in FIGS. 11 and 12 from what is shown in FIGS. 2–7 and 3A–7A. Consequently, the pattern of implant windows 60 in the phosphosilicate glass 42′ of FIGS. 11 and 12 does not correspond to the pattern of implanted gates 14a–14g shown in FIG. 2. Analogously, the pattern of ion implant windows 60 is different from the pattern of ion implant windows 48 in phosphosilicate glass layer 42 of FIGS. 6 and 7.

The thermal oxide 52 is grown from a 2000 Angstroms thick blanket layer of undoped polycrystalline silicon (not shown) which upon complete oxidation results in a thermal oxide coating of about 6000 Angstroms in thickness. However, the thickness of thermal oxide 52 can be varied, as well as the thickness of the polycrystalline silicon layer from which it is derived. The thermal oxide 52 can be etched with hydrofluoric acid, ammonium bifluoride or the like. These are the same etchants as used in etching the reflowable glass layer 42′. However, the glass layer 42′ etches over twice as fast as the thermal oxide coating 52. Hence, etching of source and drain contact windows 44′ and 46′ can be completed long before thermal oxide coating 52 would be penetrated. Programming by ion implantation, metallization, and passivation would then be done as described in connection with the preceding example of this invention.

The second embodiment of the invention is included to demonstrate that the protective coating 34 need not be limited to silicon nitride and need not be removed from over the islands of field oxide 24. It can be of any suitable material that will isolate the ROM gate lines 28a that would otherwise be exposed within the ion implant windows 48 of FIGS. 6 and 7 or ROM gate lines 28a′ that would otherwise be exposed within the ion implant windows 60 of FIGS. 11 and 12. Generally speaking layers 34 and 52 should be electrically isolating, generally dense, and not be readily etchable by the same etchants which are used to etch the ion implant windows 48 and 56 in the respective phosphosilicate layers 42 and 42′ of the two invention embodiments. To indicate the two invention embodiments shown in the drawing are otherwise similar, without resorting to duplicating the foregoing specific description, portions of FIGS. 8–12 and 8A–12A have been given reference numerals corresponding to similar portions in FIGS. 3–7 and 3A–7A but followed by a prime (′) designation.

The embodiments of the invention in which an exclusive property or privilege is claimed are defined as follows:

1. A method of making a high speed and high density IGFET read-only memory and encoding it late in said method comprising:
   forming a grid of gate thickness dielectric on a semiconductor surface within an area covered by a field thickness dielectric;
   forming a pattern of diagonally disposed gate lines on said grid to provide an array of operative IGFET channels interconnecting semiconductor input and output regions;
   covering said area with a first insulating coating that has contact openings to said regions;
   covering said first insulating coating with a second insulating coating that can be etched without also significantly etching said first insulating coating;
   etching ion implant windows in said second insulating coating over predetermined IGFET channels while etching contact openings to said regions, without penetrating the first insulating coating over said channels;
   significantly altering threshold voltage of said predetermined channels but not the balance of said channels by an ion implantation that only penetrates said second insulating coating by passing through said windows, so as to encode said array;
   providing a pattern of conductor lines on said second insulating coating that are diagonally disposed with respect to said grid orthogonally disposed with respect to said gate lines and which do not cross said ion implant windows, effective to provide a high density read-only memory without drain lines overlapping said ion implant windows and producing undesirable capacitances to slow down memory operation.

2. A method of making a high speed and high density IGFET read-only memory and encoding it late in said method comprising:
   forming an orthogonal grid of gate thickness dielectric on a silicon surface within an area covered by a field thickness dielectric;
   providing diagonally disposed generally parallel gate lines on said grid that appropriately cross grid columns and rows to form a matrix of gates with interjacent silicon regions covered by thin oxide communicating adjacent gates;
   removing the exposed thin oxide and diffusing a conductivity determining impurity into said silicon regions and into the polycrystalline silicon gate lines;
   defining on said area a first insulating coating that covers substantially all of said gates and has first contact openings over said silicon regions;
   applying a blanket second insulating coating that can be etched substantially more rapidly than said first insulating coating;
   etching second contact openings in said blanket second coating over said first contact openings and ion implant windows over predetermined gates, without penetrating portions of the first insulating coating exposed in said windows;
   selectively significantly altering threshold voltage at said predetermined gates by ion implantation through said windows, and thereby encode said gate matrix; and
   providing substantially parallel conductor lines on said second insulating coating that are diagonally disposed with respect to said grid and orthogonally disposed with respect to said gate lines, whereby alternate conductor lines can provide alternate source and drain lines for a high density read-only memory without drain lines overlapping said ion implant windows and producing undesirable capacitances to slow down memory operation.

3. A method of making a high speed and high density IGFET read-only memory and encoding it late in said method comprising:
   forming a grid of gate thickness oxide on a silicon surface within an area covered by a field thickness dielectric;

providing a diagonal array of sinuous polycrystalline silicon gate lines on said grid, wherein the sinuous gate lines alternately orthogonally cross grid columns and rows on said thin oxide to form a matrix of IGFET channels and interjacent silicon regions, with each region contacting four IGFET channels;

doping said regions and gate lines oppositely from said silicon surface;

applying a silicon nitride coating over said array and etching contact openings in it over said regions;

applying a blanket coating of a silicate over said silicon nitride coated surface and etching ion implant windows in its predetermined IGFET channels in said array and also over the first-mentioned contact openings;

implanting ions selectively into said predetermined channels through said ion implant windows to increase threshold voltage of said predetermined channels beyond a normal gate line operating voltage; and forming substantially parallel metal lines on said blanket silicate coating for contacting said regions, said metal lines being diagonal to said grid and orthogonal to said gate lines wherein a metal line contacts successively positioned regions in successive rows, and alternate lines provide either source region or drain region contact, without significant overlap of ion implant windows.

4. A method of making a high speed and high density IGFET read-only memory and encoding it late in said method comprising:

forming an orthogonal grid of gate thickness dielectric on a silicon surface within an area covered by a field thickness dielectric;

providing diagonally disposed generally parallel but sinuous polycrystalline silicon gate lines on said grid, wherein the sinuous gate lines orthogonally cross grid columns and rows to form a gate region matrix with cruciform thin oxide regions exposed therebetween;

removing the thin oxide from said cruciform regions;

diffusing a conductivity determining impurity simultaneously said cruciform regions and into said polysilicon gate lines;

defining a silicon nitride coating on said area over substantially all of said gate regions while leaving first contact openings over said cruciform regions;

applying a blanket coating of a phosphosilicate glass over said silicon nitride coated surface;

etching ion implant windows in said glass over predetermined gate regions and second contact openings over said first contact openings;

selectively significantly altering threshold voltage of said predetermined gate regions by ion implantation through said windows; and forming substantially parallel metal lines on said blanket insulating coating that are diagonally disposed with respect to said grid and orthogonally disposed with respect to said gate lines, whereby alternate metal lines can respectively provide source and drain lines for a high density read-only memory without drain lines overlapping said ion implant windows to slow memory speed by undesirable capacitance effects.

5. Encoding a fast, high density IGFET read-only memory late in the method of making it comprising:

forming an orthogonal grid of gate thickness dielectric on a silicon surface within an area covered by a field thickness dielectric;

providing diagonally disposed generally parallel but sinuous polycrystalline silicon gate lines on said grid, wherein the sinuous gate lines orthogonally cross grid columns and rows to form a gate region matrix with cruciform thin oxide regions exposed therebetween;

removing the thin oxide from said cruciform regions;

diffusing a conductivity determining impurity simultaneously into said cruciform regions and into said polysilicon gate lines;

applying a blanket coating of high resistivity polycrystalline silicon onto said area over said gate lines;

oxidizing the blanket coating through its thickness to form a slowly etchable first insulating coating;

etching the first insulating coating to provide first contact openings over said cruciform regions and leave slowly etchable protective patches over substantially all of said gate regions;

applying a blanket coating of a phosphosilicate glass onto said area over the first insulating layer;

etching ion implant windows and second contact openings in the phosphosilicate glass, said ion implant windows being disposed over predetermined gate regions and said second contact openings being disposed over said first contact openings;

performing a blanket ion implantation on said coated area with sufficient energy to significantly affect matrix gate regions below said windows but not other gates in the matrix; and metallizing the coated area to provide substantially parallel alternate metal source and drain lines on said phosphosilicate glass that are diagonal to said grid and orthogonal to said gate lines, so as to provide a high density read-only memory with reduced gate line-drain line capacitance.

* * * * *